United States Patent [19]

Bachle et al.

[11] 4,130,826
[45] Dec. 19, 1978

[54] MONOLITHIC INTEGRATED SEMICONDUCTOR CIRCUIT

[75] Inventors: Erich Bachle, Ulm; Hermann Clauss, Leingarten, both of Germany

[73] Assignee: Licentia Patent-Verwaltungs-G.m.b.H., Frankfurt am Main, Germany

[21] Appl. No.: 747,222

[22] Filed: Dec. 3, 1976

[30] Foreign Application Priority Data

Dec. 6, 1975 [DE] Fed. Rep. of Germany ....... 2555047

[51] Int. Cl.$^2$ .......................................... H01L 29/72
[52] U.S. Cl. ...................................... 357/34; 357/43; 357/45; 357/48; 357/92
[58] Field of Search ..................... 357/46; 357/34, 92, 357/43, 45, 46, 48

[56] References Cited

U.S. PATENT DOCUMENTS

| | | | |
|---|---|---|---|
| 4,027,324 | 5/1977 | Yagi et al. | 357/34 |
| 4,032,958 | 6/1977 | Yagi et al. | 357/34 |

*Primary Examiner*—Edward J. Wojciechowicz
*Attorney, Agent, or Firm*—Spencer & Kaye

[57] ABSTRACT

A monolithic integrated semiconductor circuit including a plurality of low on-state resistance vertical bipolar switching transistors for connecting a series of input lines, as desired, to one or more output lines wherein each of said switching transistors comprises a substrate region of a first type of conductivity having a first layer thereon of the second type of conductivity, a second layer on the first layer and of the second type of conductivity but with a lower doping than the first layer, a third layer of the first type of conductivity in the second layer, a fourth layer of the second type of conductivity in the third layer, a tank like structure formed from the first layer and a region encircling the second third and fourth layers and of the second type of conductivity, a first frame like region of the second type of conductivity encircling the tank like structure, a second frame like region encircling the first frame like region and being of the first type of conductivity and in contact with the substrate region, and connections for the tank like structure, the substrate region and the third and fourth layers.

24 Claims, 8 Drawing Figures

MONOLITHIC INTEGRATED SEMICONDUCTOR CIRCUIT

BACKGROUND OF THE INVENTION

The invention relates to a monolithic integrated semiconductor circuit with a plurality of low on-state resistance switching transistors in accordance with bipolar technology, particularly for use in switching networks of telephone exchange devices and transmission devices, which permit connection of a series of input lines to one or several output lines as desired.

From the magazine "Bulletin Technique" PTT 2 (1973), p. 79–83, a completely integrated matrix crosspoint is known which is based on the conventional transistor crosspoint. It comprises a bipolar switching transistor in the series branch and a fixed resistor in the shunt branch, across which the switching transistor is connected and disconnected by means of a trigger circuit. In order to construct it in monolithic integrated form, it was so modified that a NPN-transistor is used as a switching transistor and a trigger circuit having a PNP-lateral transistor as a current source is used instead of the fixed resistor in the shunt branch and a NPN-transistor is used as a control. Both transistors of the trigger circuit are connected by their collectors to the base connection of the switching transistor. The NPN-transistor of the trigger circuit is in turn controlled bistably by means of a flip flop. If the NPN transistor is conductive then the switching transistor is blocked. If however the NPN transistor is blocked then the switching transistor is made conductive by the PNP-lateral-transistor. This circuit, in conventional bipolar monolithic technology has the disadvantage that the PNP-lateral-transistor is constantly current carrying, regardless of whether the switching transistor is blocked or conductive. As a result there is always a relatively high dc dissipation in the crosspoint. Consequently the packing density of the semiconductor crosspoint is limited in a matrix switching package established with the semiconductor crosspoints because the power dissipation in the spatially small matrix switching package is a substantial influence as:

1. The reliability of the semiconductor crosspoints is a function of the crystal temperature of the semiconductors and,
2. The dc dissipation per package is limited to approximately 300 mW and thus determines the scope of integration per unit.

A matrix switching package therefore has only 2 × 2 symmetrical semiconductor crosspoints, including the control logic circuit, on the same semiconductor chip.

Furthermore, the crosspoint known from the magazine has the disadvantage that the switching transistor requires a directed collector biasing current which limits the freedom of speech path connection in the switching network to connections from one side to the other and demands an expensive junctor circuit with lowering of current sinks and capacitatively or inductively coupled switching. A relatively large power dissipation in the junctor circuits is the result. The collector current is exceptionally high ($I_C \approx 10$ mA) and flows across a switching transistor into the junctor circuit.

As a result of the solution stated in German Offenlegungsschrift No. 23 63 699, (U.S. Pat. No. 3,931,475, issued Jan. 6, 1976, inventors: Bächle, Kliem and Rall) the stated disadvantages of this monolithic circuit known from the magazine are largely avoided. With this crosspoint a small shunt attenuation is achieved in an advantageous manner as a result of the control transistor operating in the active region when the switching transistor is in the on-state and when this cross-point is blocked, the control transistor is also blocked in an advantageous manner. In order to increase the shunt attenuation when the control transistor is blocked and to optimise the blocking action of the switching transistor, a voltage-dependent resistor is connected to the base of the switching transistor in the trigger circuit, said resistor being controlled by the base potential of the switching transistor so that, when the switching transistor is conductive, it operates in the high value resistance range and, when the switching transistor is blocked, it operates in the low value resistance range. In fact, the voltage-dependent resistor comprises a transistor which is provided with negative feed back to the emitter by means of a resistor; the base-emitter path of the transistor is constantly current-carrying. This crosspoint has in fact the advantage of a substantially smaller dc dissipation than the solutions previously stated, however a switching package with electronic crosspoints which, as is known, requires a trigger circuit, a flip flop, which gives the cross-point its bistable character, and a control logic circuit besides the switching transistor, still has a very large area and is therefore expensive.

The power dissipation of a 5 × 2 switching package which may be manufactured by normal bipolar technology and used for symmetrical switching, i.e. a switching package having 20 switching transistors, is at approximately 300 mW and its area on a silicon chip is approximately (4.5 × 4.5) mm², if a maximum of four switching transistors are in the on-state. Thus the NPN switching transistor takes up an area of approximately (200 × 120) $\mu m^2$ when there is an on-state resistance of approximately 13 Ω (direct current of the base $I_B = 2$ mA).

A switching transistor manufactured in previously known bipolar technology with an on-state resistance of approximately 5 Ω requires an area of (400 × 400) $\mu m^2$ even with a base current of 2 mA.

SUMMARY OF THE INVENTION

It is an object of the invention to avoid the described disadvantages of the previously known monolithic integrated semiconductor crosspoints.

It is a particular object of the invention to provide a monolithic integrated semiconductor array of a type, such as that stated at the outset, with its switching transistors operable with a very small dissipation, so that as many switching transistors as possible may be arranged with their trigger circuit on a semiconductor chip without any reciprocal interference and with good switching properties.

According to the invention, there is provided a monolithic integrated semiconductor array comprising a plurality of low on-state resistance vertical bipolar switching transistors formed in a common semiconductor body having a substrate region of a first type of conductivity, each of said switching transistors including a first layer of a second type of conductivity on said substrate region, a second layer of said second type of conductivity on said first layer and of lower doping than said first layer, a third layer of said first type of conductivity in said second layer, a fourth layer of said second type of conductivity in said third layer, a region of said second type of conductivity encircling said second, third and fourth layers to form, with said first layer a tank like structure, a first frame like region of said second type of conductivity encircling said tank like sturcture, a second frame like region of said first type of conductivity encircling said first frame like region and in contact with said substrate region and first and second connecting means on said tank like structure and on said fourth layer respectively for connecting to lines to be switched through by the transistor, third connecting means on said third layer for connection to a trigger circuit for the transistor and fourth connecting means on said substrate region for connection to a potential negative with respect to said tank like structure.

Further according to the invention, there is provided a semiconductor circuit comprising a monolithic integrated semiconductor array having a plurality of low on-state resistance switching transistors in bipolar technology, particularly for use in switching networks of telephone exchanges and transmission devices, for selectively connecting a series of input lines as desired to one or several output lines, characterized in that each connecting transistor (switching transistor) is constructed as a vertical NPN transistor which, as well as a large downward current amplification factor (downward d.c. transfer ratio) also has a large upward current amplification factor (upward d.c. transfer ratio) and is characterized by the following features:

(a) a first selective layer of a second type of conductivity opposite to a first type of conductivity is introduced into a substrate of said first type of conductivity, (b) a less heavily doped second layer of said second type of conductivity is epitaxially grown on to said first layer, (c) a third layer of said first type of conductivity is selectively introduced into said second layer, (d) a fourth layer having as large an area as possible of said second type of conductivity is selectively introduced into said third layer, (e) said second, third and fourth layers, which form said vertical NPN transistor, are enclosed by a region of said second conductivity type which together with said first layer forms a largely tank shaped region of said second type of conductivity which surrounds said transistor, (f) said tank shaped region is surrounded by a first frame-like region of said second type of conductivity, (g) said first frame like region is surrounded by a second frame like region of said first type of conductivity, said region extending as far as the substrate, being more highly doped than the substrate and serves to insulate said vertical NPN transistor, (h) said substrate, said tank shaped region, and said third and fourth layer are provided with connections; and wherein said connection of said tank shaped region and said connection of said fourth layer are connected to the lines to be switched through, said connection of said third layer is connected to a triggering circuit and, as desired, to a control circuit, and said connection of said substrate is connected to a dc voltage potential which is negative with respect to said tank shaped region.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
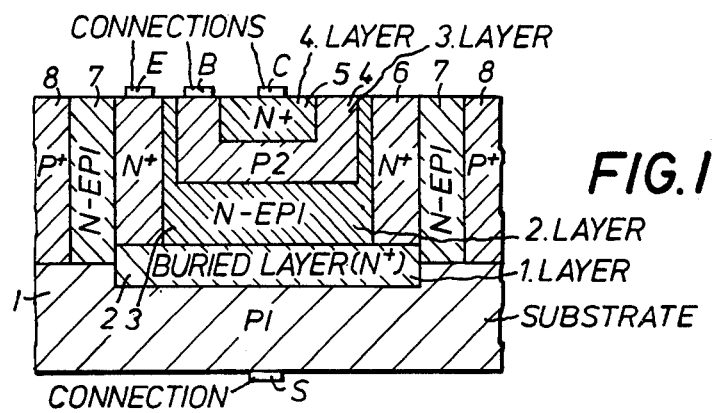
FIG. 1 shows a sectional view of a monolithic integrated switching transistor.

In a preferred embodiment of the invention, in a monolithic integrated semiconductor array having a plurality of low on-state switching transistors of bipolar technology of the type stated at the beginning, the switching transistor is constructed as a vertical NPN transistor which has not only a large downward current amplification but also a large upward current amplification and is characterized by the following features:

(a) a first layer of a second type of conductivity ($N^+$, buried layer) opposite to the first type of conductivity is selectively introduced into a substrate of a first type of conductivity (P1), (b) a less heavily doped second layer of the second type of conductivity (N-EPI) is epitaxially grown on to the first layer, (c) a third layer of the first type of conductivity (P2) is selectively introduced into the second layer, (d) a fourth layer of the second type of conductivity ($N^+$) which covers as large an area as possible is selectively introduced into the third layer, (e) the structure forming the vertical NPN transistor is surrounded by a largely tank shaped area of the second type of conductivity ($N^+$), (f) the tank shaped area is surrounded by a first frame-like area of the second type of conductivity (N-EPI), (g) the first frame-like area is surrounded by a second frame-like area of the first type of conductivity ($P^+$), which reaches the substrate, is doped more highly than the substrate and serves to insulate the vertical NPN transistor, (h) the substrate, tank shaped area, and the third and fourth layer are provided with connections (S, E, B, C) wherein the tank shaped area connection and the fourth layer connection are connected to the lines to be switched through the connection of the third layer is connected to a trigger circuit and, as desired, to a control circuit and the connection of the substrate is connected to a dc voltage potential which is negative with respect to the tank shaped area.

With this solution, a spatially very compact monolithic integrated semiconductor array may be realized in bipolar technology having a plurality of low on-state resistance switching transistors, said semiconductor array being particularly suited to use in switching networks of telephone exchange devices, as they only take up a small amount of space, cause only a small amount of dissipation and nevertheless make it possible to realize switching transistors with the required low on-state attenuation and high off-state attenuation. As a result of the special embodiment of the switching transistors, the semiconductor array in accordance with the invention makes it possible to integrate the switching transistors together with other bipolar analog circuits and bipolar digital circuits on a silicon chip in a simple manner, cheaply, with a high packing density and largely avoiding disruptive or parasitic effects. The respective switching state of the switching transistors of the monolithic integrated semiconductor array may be monitored by an additional control circuit.

In order to avoid parasitic effects within the switching transistors, constructed as NPN transistors and thus to considerably reduce their triggering power and on-state attenuation, the semiconductor circuit is constructed so that the tub or tank shaped area completely surrounds the structure forming the vertical NPN transistor.

The smallness of the switching transistors makes it possible to integrate the trigger circuit, or the trigger circuit and the control circuit, together with a plurality of vertical NPN transistors in a common semiconductor body. As a result, the monolithic integrated semiconductor array contains all of the operating assemblies necessary for operation of the switching transistors, and external expense on external circuitry is saved.

It is advisable to drive the switching transistors so that they cause small dissipation. This is achieved by connecting the connection E of the tank shaped area of the vertical NPN transistor to a first line which is at reference potential and is of low resistance to direct current, and by connecting the connection C of the fourth layer to a second line which is of high resistance to direct current and is to be connected to the first line.

For the purpose of reducing the on-state attenuation, the trigger circuit, or the trigger circuit and the control circuit, are so constructed that they include an interface circuit for triggering the respective vertical NPN transistor and a logic circuit part.

The logic circuit part is preferably designed so that it emits a binary signal to the interface circuit. Thus the binary signal of one type keeps the switching transistor in the on-state and the binary signal of the other type keeps it in the off-state. The optimum passing on of the binary signal to the switching transistor takes place via the interface circuit. It is constructed, for the purpose of achieving minimum shunt attenuation, such that with an output signal of one type, the output of the interface circuit acts as a high resistance current source to connect the vertical NPN transistor, and with an output signal of the other type the output of the interface circuit acts as a low resistance voltage source disconnect the vertical NPN transistor.

The current source of the interface circuit may be implemented advantageously as a compound circuit. This type of compound circuit may be realized particularly simply and in a space-saving manner if the compound circuit has two complementary transistors, the NPN transistor of which is connected by its emitter to the third layer of the vertical NPN transistor, and by its base to the collector of the PNP transistor of the compound circuit and by its collector on one hand to the emitter of the PNP transistor of the compound circuit and on the other hand to a first voltage source via a first resistance, the voltage of the voltage source being selected so that it is able to switch on the vertical NPN transistor via the compound circuit, and the PNP transistor is connected by its base on one hand to a second resistor and on the other hand to the first voltage source via an assembly bringing about a constant drop in voltage.

In order to further save space, the logic circuit part is carried out in I$^2$L circuit technology. The logic circuit part of the monolithic integrated semiconductor circuit may contain stores, inverters, decoders and logic input and output circuits.

An interface circuit and a store is assigned to each switching transistor and thus to each vertical NPN transistor. Preferably each store contains a flip flop having two inverters in I$^2$L technique. This has the advantage that the flip flop may be constructed such that the inverters of the flip flop may each have a NPN transistor with at least two collectors insulated from one another, wherein one of the two NPN transistors may be connected by a collector to the compound circuit via the second resistor and the other of the two NPN transistors may be connected by at least one collector to the third layer of the vertical NPN transistor either directly or via an additional circuit. As a result of these measures, the off-state attenuation of the switching transistor implemented as a vertical NPN transistor is brought to its maximum possible value.

In a particularly simple manner, this aim may be achieved if the emitters of the two NPN transistors of the flip flop are connected to a second voltage source and if the other of the two NPN transistors of the flip flop is connected by a collector directly to the third layer of the vertical NPN transistor. This embodiment does however require a sufficiently high blocking voltage for the transistors of the flip flop. If this cannot be realized with certainty, then there is an advantageous modification for the flip flop of the monolithically integrated semiconductor circuit, in that the two NPN transistors of the flip flop lie at reference potential with their emitters and the other of the two NPN transistors of the flip flop is connected by a collector to the third layer of the vertical NPN transistor via an additional circuit, wherein the additional circuit comprises a PNP transistor, realized in the technology for I$^2$L circuits, which is attached at its base to a collector of the other of the two NPN transistors of the flip flop, and an NPN transistor whose base is connected via a third resistor to its emitter (which is connected directly to a fourth voltage source) and to the collector of the PNP transistor either directly or via a fourth resistor, and whose collector is connected to the third layer of the vertical NPN transistor.

In order to set the flip flop, an inverter may be provided in I$^2$L technique, this inverter being connected by its respective collector to the base of the respective NPN transistor of the flip flop. The individual inverters of the flip flop may at the same time be part of the control logic of a switching package. This has the advantage that the trigger logic does not need to contain these inverters and as a result may be made more compact.

When using the monolithic integrated semiconductor circuit in a switching network having symmetrical crosspoints the solution in accordance with this embodiment may be modified in a simple manner such that the vertical NPN transistor and the compound circuit are provided in duplicate for every two pairs of lines to be connected and such that the other of the two transistors of the flip flop has three collectors, one collector respectively of which is connected directly to the respectively third layer of the two vertical NPN transistors.

Here too, when the blocking voltage of the flip flop transistors is not certain, a modification in accordance therewith having an additional circuit may be recognized in that the vertical NPN transistor and the compound circuit are provided in duplicate for every two pairs of lines to be connected, the NPN transistor of the additional circuit having two collectors and being connected by one collector to the respective third layer of the two vertical NPN transistors.

Prefereably the transistors of the compound circuit are formed from the interconnection of a further vertical NPN transistor and a lateral PNP transistor in a monolithic integrated embodiment, these being made in accordance with the technology for I²L circuits, wherein the lateral PNP transistor is formed so as to have as small an area as possible, has a rectangular structure and has a current amplification factor $\beta$ in the collector current range $I_C = 5 \ldots 20$ μA in emitter connection (for alternating current) of the order of magnitude of $\beta = 2 \ldots 4$. This has the advantage that the lateral PNP transistors may be made extremely small.

Usually in a switching network, several switching transistors are connected on one line or column. The solution in accordance with the invention for the monolithic integrated semiconductor array now makes it possible to assemble, on one semiconductor chip, these switching transistors in a simple manner such that all vertical NPN transistors lying on one line or column of a switching array and constructed as switching transistors are assembled in the second frame-like area and, in at least two of these transistors, one part of their respective tank shaped area is common.

Another solution consists in that all of the vertical NPN transistors lying on one line or column of a switching array and constructed as switching transistors are assembled in the second frame-like area and have a common tank shaped area. As a result of collecting together the switching transistors, space is again saved so that a large proportion of switching transistors may be housed on one semiconductor chip with their trigger circuits.

Referring now to the drawings, the sectional view of a switching transistor for the monolithic integrated semiconductor circuit is shown in FIG. 1. A first layer 2 of a second type of conductivity N+ opposite to the first type of conductivity is selectively introduced as a buried layer in a substrate 1 of a first type of conductivity P1. A less heavily doped second layer 3 of the second type of conductivity N-EPI is epitaxially grown on the first layer 2. A third layer 4 of the first type of conductivity P2 is selectively introduced into the second layer 3. A fourth layer 5 having as large an area as possible of the second type of conductivity N+ is selectively introduced into the third layer in similar manner. The structure forming the vertical NPN transistor is surrounded by a largely tank shaped area of the second type of conductivity N+ formed by a region 6 and the buried layer 2. This tank shaped area 2 and 6 is in turn surrounded by a first frame-like area 7 of the second type of conductivity N-EPI. The first frame-like area is surrounded by a second frame-like area 8 of the first type of conductivity P+, which reaches as far as the substrate 1, is more heavily doped than the substrate and serves to insulate the vertical NPN transistor. Substrate 1, tank shaped area 2 and 6, and third and fourth layer 4 or 5 are provided with connections S, E, B, and C respectively.

Figure 2:
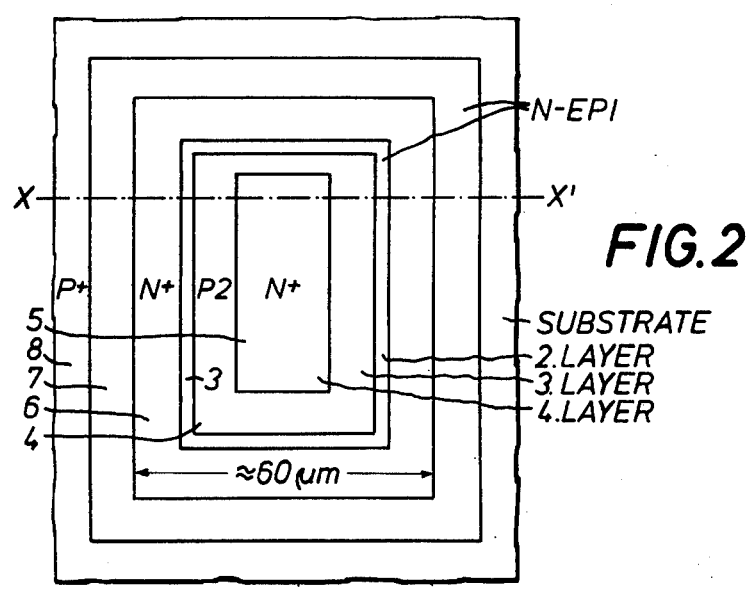
FIG. 2 shows the lay-out of the transistor of FIG. 1.

FIG. 2 shows the surface lay-out of the switching transistor shown in FIG. 1. The same designations used in FIG. 1 are valid here. The connections E, B and C for contact are not indicated in FIG. 2 for the sake of clarity, as their position and shape on the respective layer depends on the respective arrangement of the switching transistor in the monolithic integrated semiconductor circuit.

As described in German Offenlegungsschrift No. 23 63 669 already cited, the switching transistor should be driven without collector current here too. Its on-state resistance between the connections E and C is $$r_D \approx r_{EB} + r_{CO} + U_T/I_B(1 + B_u) \tag{1}$$

this equation is true for all I²L NPN transistors which are driven inversely, i.e. as in FIG. 1 upwardly from below and in which the "upward current amplification factor" (upward d.c. transfer ratio) $B_u$ is substantially smaller than the "downward current amplification factor" (downward d.c. transfer ratio) $B_d$.

In this equation
$I_B$ = base direct current, $r_{EE}$,
$r_{CC}$ = emitter or collector bulk resistance,
$U_T$ = temperature voltage $\approx 26$ mV at 25° C.

When using the technology for circuits in I²L technique, in contrast to normal bipolar circuits, the upward current amplification of the NPN transistor is relatively large (e.g. 10, i.e. the on-state resistance of the NPN transistor is relatively low according to Equation (1)).

As FIG. 1 shows the area 6 extends to the buried layer 2 in this embodiment. As a result, the tankshaped area formed from the parts 2 and 6 completely surrounds the structure forming the vertical NPN transistor. As may be seen, the two parts 2 and 6 of the tank shaped area are of the same type of conductivity N+. The low N+ diffusion, which extends from the surface of the silicon crystal to the N+ buried layer 2, has the advantage that the bulk resistance $R_{EE}$ of the switching transistor is substantially smaller with respect to an embodiment in conventional technology (with an appropriate bulk resistance $r_{CC}$), as the high resistance portion of the bulk resistance is almost omitted in the epitaxial layer. Furthermore the deep N+ diffusion prevents a parasitic PNP transistor from being formed from the P base region 4, the N epitaxial layer 3 and the P substrate 1, in which the arrangement according to FIG. 1 is embedded, if the switching transistor is switched on. The parasitic PNP transistor would divert a considerable part of the base current of the switching transistor to the substrate so that a fairly high switching power would be necessary for the switching transistor and moreover would reduce its upward current amplification factor, as a result of which the on-state resistance of the switching transistor would be undesirably increased. At the same time the loss of power in the switching transistor would increase.

As an example, a switching transistor with $B_u > 10$, $r_{EE} < 2.5$ Ω, $r_{CC} < 2$ Ω and constructed according to FIGS. 1 and 2 has a forward resistance $r_D < 7Ω$ with an area requirement of approximately (60 × 85) μm². Moreover, if the connection contacts are taken into consideration then the required area of the switching transistor is less than (75 × 100) μm². If the switching transistor has to be insulated when used in a switching array, then an additional P+ separation framework is necessary which increases the area up to approximately (115 × 130) μm².

In order that the forward resistance is $r_D < 7\Omega$ with the switching transistor having a base current $I_B = 1$ mA, the following technical parameters must be sought with an area requirement of approximately $(75 \times 100)$ $\mu m^2$:

| a) | for the layer resistances (sheet resistance):- | |
|---|---|---|
| | P base zone | $100 \ldots 200 \Omega p.sq.$ |
| | collector zone $N^+$ (embedded in the P base) | $3 \ldots 10 \Omega p.sq.$ |
| b) | epitaxial layer:- | |
| | thickness | $5 \ldots 7 \mu m$ |
| | specific resistance | $\approx 0.5 \Omega cm$ |
| c) | penetration depths:- | |
| | collector region into P base region | $1.5 \ldots 2.5 \mu m$ |
| | P base region into N epitaxial layer | $2.5 \ldots 3 \mu m.$ |

With these parameters the breakdown voltage for the emitter base diode and collector base diode of the switching transistor is established at more than 7 volts.

Figure 3:
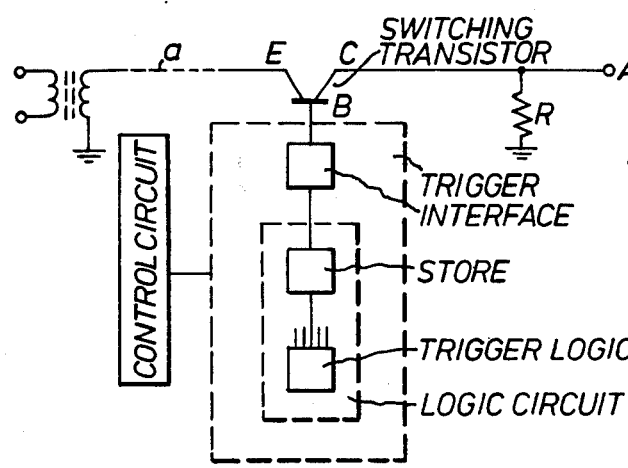
FIG. 3 shows a block diagram of a monolithic integrated semiconductor circuit.

The circuit of the switching transistor is shown in FIG. 3, this circuit being particularly suited for use in switching networks of telephone exchange and transmission devices which make it possible to connect a series of input lines to one or more output lines as desired. The switching transistor is shown symbolically here with its connections E, B, C agreeing with FIG. 1, these connections may also be designated as emitter, base and collector, wherein of course, because of the structure of the vertical NPN transistor shown in FIG. 1, the emitter may also be designated as a collector and the collector may also be designated as an emitter. In order to avoid confusion, reference is always made to connection E and connection C in the following, these being in contact with the vertical NPN transistor according to FIG. 1.

According to FIG. 3, connection E and connection C are connected together to the lines a and A* to be connected and the connection B is connected to a trigger circuit and, as desired, to a control circuit. The control circuit serves to monitor the switching state of the switching transistor and may be connected directly to the connection B of the switching transistor or to any desired other point in the trigger circuit, the latter exhibiting a change in voltage corresponding to the voltage changes at the connection B. However, it can only be used for monitoring purposes. It is not used for operating the switching transistor.

The substrate connection S shown in FIG. 1 is connected to a dc voltage potential which is negative with respect to the tank shaped area 6 (with the E connection). This connection serves to avoid parasitic effects within the monolithic integrated semiconductor array in that, in a manner known per se, a barrier layer, insulating the individual components from one another, is formed between the construction elements and the substrate, the construction elements being at a substantially positive potential.

A trigger circuit or trigger circuit and control circuit may be integrated with a plurality of vertical NPN transistors in a monolithic package. This is achieved all the better the lower it is possible to keep the loss of power of the components of the monolithic integrated semiconductor circuit.

The switching transistor manages with a minimum of dissipation if, as FIG. 3 shows, the connection E of the switching transistor is connected to a first line a which is of low resistance for direct current and is at reference potential and if connection C is connected to a second line A* which is of high resistance to direct current and is to be connected with the first line. In this embbodiment, the line a is connected to the reference potential via a transformer winding. The resistor R attached to the line A*, has a resistance value of approximately 100 kΩ brings about a high resistance leak in the line A*.

The trigger circuit comprises an interface circuit for triggering the switching transistor and a logic circuit.

The logic circuit gives a binary output signal for the purpose of connecting and disconnecting the switching transistor. For the purpose of optimum triggering of the switching transistor, however, an interface circuit is interconnected between the logic circuit and the switching transistor. In order to avoid on-state attenuation, the interface circuit is constructed so that, with an output signal of one type the output of the interface circuit acts as a high resistance current source for connection with the vertical NPN transistor. When disconnecting the switching transistor, it is controlled from the interface circuit into the off-state.

The logic circuit part generally comprises, as FIG. 3 shows, one store per interface circuit and one switching transistor, and a trigger logic for a plurality of switching transistors with their respective interface circuit and respective store.

Figure 4:
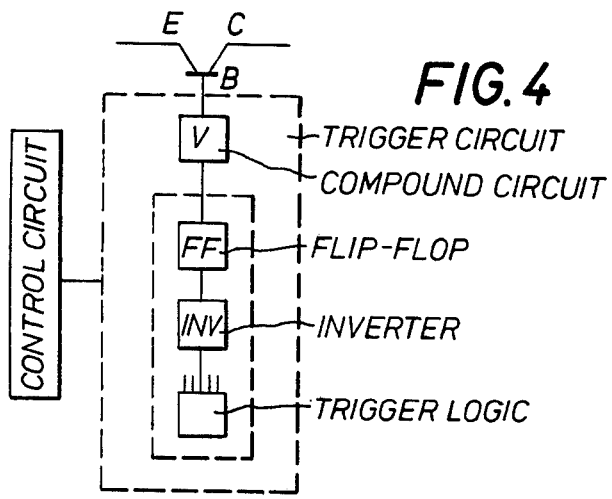
FIG. 4 shows a block diagram of a monolithic integrated trigger circuit.
Figure 5:
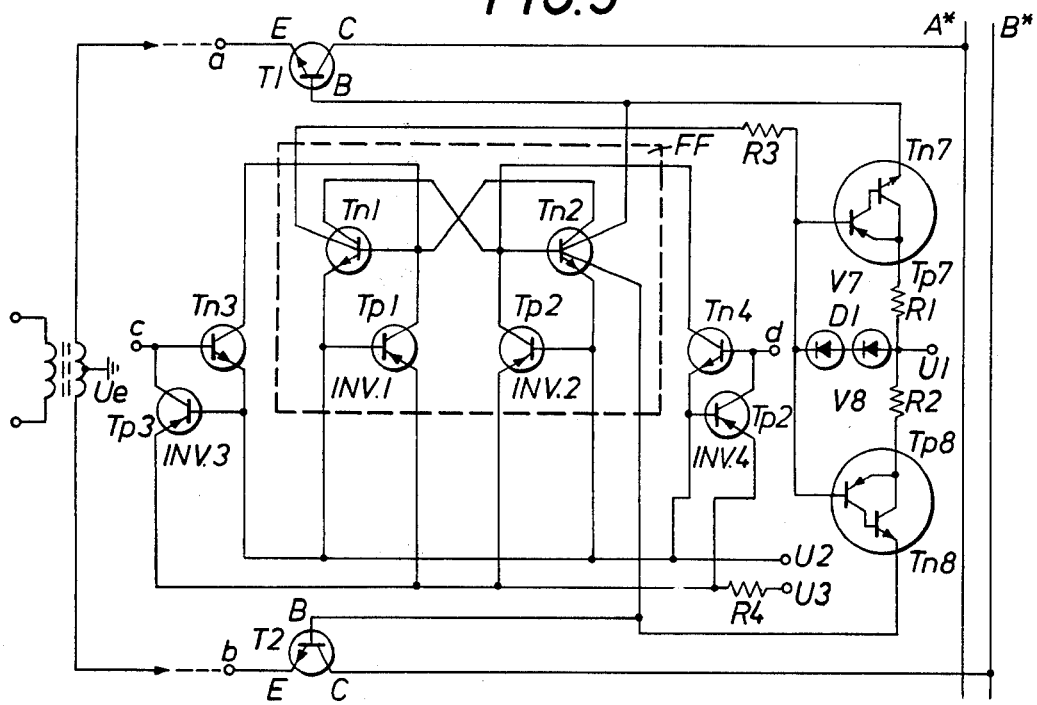
FIG. 5 shows a circuit diagram of a symmetrical semiconductor crosspoint with inverters with a high blocking voltage.

It is shown in FIG. 4 that a compound circuit may serve as a current source in the interface circuit and a flip flop with controlling variable inverters may serve as a store. The block circuit shown in FIG. 4 is to be described in greater detail with reference to FIG. 5. FIG. 5 shows a semiconductor crosspoint as an embodiment of the monolithic integrated symmetrical semiconductor circuit in accordance with the invention. The switching transistors T1 and T2 are constructed according to FIG. 1 and are connected according to FIG. 3. Their respective E connections are connected to first lines a and b which are of low resistance to direct current and are at reference potential. The low resistance direct current connection is achieved by means of a subscribers transformer Ue. The C connections of the switching transistors are attached to second lines A* and B* of high resistance to direct current. The previously described mode of operation of the switching transistors T1 and T2 is known from German Offenlegungsschrift No, 23 63 669 and is thus not described in detail here.

The base connections B of the switching transistors are connected to a trigger circuit according to FIG. 4, of which only the flip flop FF having two inverters INV1 and INV2 in I²L technique and the compound circuits V7 and V8 are shown. Each compound circuit has two transistors Tn7, Tp7 or Tn8 and Tp8 of opposite types of conductivity respectively. At first the compound circuit V7 will be considered. Its NPN transistor Tn7 is connected by its emitter to the base of the switching transistor T1, its base is connected to the collector of the PNP transistor Tp7 and its collector is connected, on one hand, to the emitter of the PNP transistor Tp7 and on the other hand to a first voltage source U1 via a first resistor R1, the voltage of the voltage source U1 being selected such that it is able to switch on the switching transistor via the compound circuit. Its PNP transistor Tp7 is connected by its base, on one hand, to a second resistor R3 and, on the other hand, to the first voltage source U1 via a component D1 bringing about a constant voltage drop. Two diodes driven in the forward direction and realized in I²L technology may serve as a construction element, for example, in this embodiment, said construction element bringing about a constant voltage drop on passage of current.

The compound circuit V8, which is connected to the base of the switching transistor T2, is connected in the same manner as the compound circuit V7 and is also connected to the first voltage source U1. The base connections of the compound circuits V7 and V8 are connected together and both compound circuits use the same construction element D1 to provide a constant voltage drop.

The inverters INV1 and INV2 of the trigger circuit FF each have a NPN transistor Tn1 and Tn2 having at least two collectors insulated from one another. The transistor Tn1 has two collectors, one of which is connected to the compound circuits V7 and V8 via the second resistor R3. The second collector is connected to the base of the NPN transistor Tn2 of the inverter INV2.

The other transistor Tn2 of the two NPN transistors has three collectors, a first of which is connected to the base of one transistor Tn1 of the inverter INV1, a second collector is connected to the base of the switching transistor T1 and the third collector is connected to the base of the switching transistor T2.

The compound circuit causes the control current to be fed to the base of the switching transistor in a high impedance manner when the switching transistor is switched on. Both transistors of the compound circuit operate in the active range. A voltage from the voltage source U1 of approximately 5 volts and a voltage drop across the component D1 of 1.4 volts is advantageous for this operation.

Changes in the total current amplification factor $\beta$ total of the transistors of the compound circuit, which bring about a change in the base current of the switching transistor, are largely balanced out by the component D1 with the constant voltage drop and the negative feedback resistor R1 of the compound circuit V7 or R2 of the compound circuit V8. The component D1 with the constant voltage drop in the compound circuit moreover fulfils the task of making the input resistor of the lateral PNP transistor Tp7 or Tp8 and thus of the compound circuit have the lowest possible resistance in order to increase the output resistance of the compound circuit. This output resistance of the compound circuits is also increased for the purpose of high resistance supply of the base current for the switching transistors by means of the negative feedback resistors R1 and R2.

In order to be able to block the switching transistors in a desirable manner at low resistance, the emitters of the two NPN transistors Tn1 and Tn2 of the flip flop FF in FIG. 5 are connected to a second voltage source U2 which may have a voltage of −3 V, for example.

The trigger stage (flip flop) in I²L technique requires no resistors and thus uses only a very low power, i.e. 0.07 mW.

Even its area requirement is small as it may be housed in a common N-island in the substrate along with all the other I²L digital circuits of the monolithic integrated semiconductor array.

The switching transistors T1 and T2 are switched on if the transistor Tn1 of the flip flop FF is conductive. The compound circuits obtain a negative voltage via the resistor R3 whereby the compound circuits are conductive and the switching transistors T1 or T2 switch on at a high value alternating current resistance of more than 100 kΩ. The transistor Tn2 of the flip flop FF is OFF in this case and its collector-emitter paths form a high resistance shunt at the base of the switching transistors.

If the transistor Tn2 of the flip flop is conductive, then the voltage source U2, i.e. approximately −3 V, is applied to the base connections of the switching transistors. This voltage is applied in a low resistance manner to the base connections of the switching transistors T1 and T2 via the collector-emitter paths of the transistor Tn2 driven to complete saturation. The collector-emitter resistor of the transistor Tn2 is thus < 100Ω. As the transistor Tn2 is conductive, then the transistor Tn1 of the flip flop is OFF. The compound circuits V7 and V8 do not obtain any control current and are thus also OFF. In this case, they form a high resistance shunt to the base of the switching transistors and do not limit the OFF-state of the switching transistors by the low resistance transistor Tn2 of the flip flop.

In order to set the flip flop FF, one inverter INV3 and INV4 respectively are provided in I²L technique, said inverter being connected by its respective collector to the base of the respective NPN transistor of the flip flop. Thus the inverter INV3 is assigned to the transistor Tn1 and the inverter INV4 is assigned to the transistor Tn2. The setting inverters may be advantageously integrated into the crosspoint network, as they require little space there and simplify the triggering logic.

In FIG. 5, all of the emitters of the NPN transistors of the inverters INV1 to INV4 are connected to the second voltage source U2. The injectors of the inverters are supplied by a third voltage source U3 jointly via a resistor R4 in a simple manner. The voltage of this third voltage source is approximately of the same order of magnitude as that of the first voltage source U1 so that a single voltage source may be provided for the voltage sources U1 and U3.

If the voltage of the voltage source U1 is, for example, 5 V and if the collector current of the transistor Tn2 of the flip flop FF is selected to be approximately 100 μA, then the resistor R3 must have such a high resistance value between the flip flop and the compound transistor circuits that it requires a large area. Preferably it is manufactured as a pinch resistor or with the aid of ion implantation.

However, it may be disadvantageous in the circuit according to FIG. 5 that:
1. There is a barrier voltage of approximately 8 V occurring between collector and emitter of the blocked transistor Tn1 of the flip flop. However, with this barrier voltage with transistors in I²L technique, breakdowns in the collector-emitter path are to be reckoned with. A current independent of the state of the flip flop then flows constantly across the resistor R3 so that the certainty of operation of the circuit is endangered. Furthermore it is disadvantageous that:
2. All I²L digital circuits, for example the flip flop and the setting inverters INV3 and INV4 are applied by their emitters to the potential of the second voltage source U2, i.e. −3 V. As a result, the triggering logic of the crosspoint must be matched to the potential ratios which involves additional expense.

Figure 6:
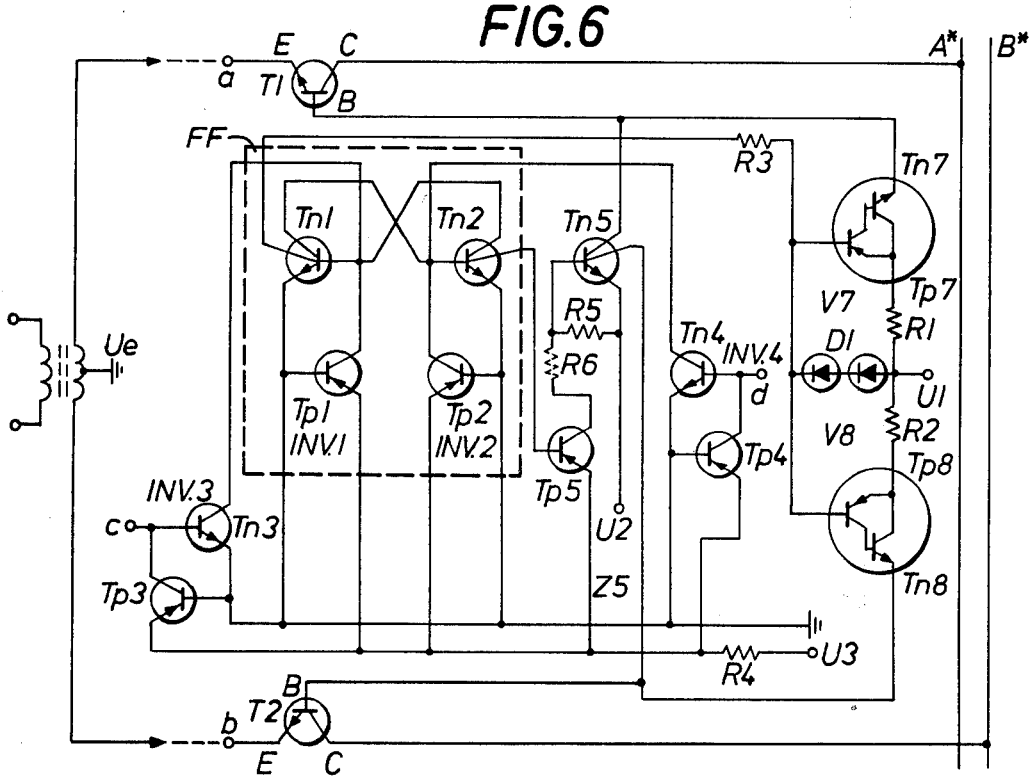
FIG. 6 shows a circuit diagram as in FIG. 5 but for inverters with a low blocking voltage.

A modification which does not have the above disadvantages is shown in FIG. 6. With this crosspoint, the two NPN transistors Tn1 and Tn2 of the flip flop are applied by their emitters to reference potential. Our transistor Tn1 has its collectors connected as shown in FIG. 5. The other transistor Tn2, however, is connected by one of its collectors to the respective base of the switching transistors via an additional circuit.

The additional circuit consists of a PNP transistor Tp 5 which is connected by its base to a collector of the other transistor Tn2 of the two NPN transistors of the flip flop, and the NPN transistor Tn5 which is connected by its base, via a third resistor R5, to its emitter which is directly connected to the second voltage source U2 and by its two collectors to the respective base connections B of the switching transistors T1 and T2.

A resistor R6 may be provided between the collectors of the PNP transistor Tp5 and the base of the NPN transistor Tn5 of the additional circuit for the purpose of limiting the collector current. However, this may be omitted with selected dimensioning of the I$^2$L crosspoint. By selecting the appropriate dimensions, the current amplification factor $\beta$ is made to drop sharply as the collector current increases so that, as a result, current limitation already takes place automatically.

The emitters of the NPN transistors Tn3 and Tn4 of the setting inverters INV3 and INV4 are also applied to reference potential with this crosspoint according to FIG. 6, so that, here, there are no difficulties in switching on the triggering logic as a result of unfavourable potential ratios.

Current supply of the injectors of the PNP transistors Tp 1 to Tp 5 takes place here, via a resistor R4, from a voltage source U3 which may have the same voltage value as the voltage source U1.

In cases in which there are no special requirements made for crosstalk attenuation, the crosspoints shown in FIGS. 5 and 6 may also be used unsymmetrically. In these cases, the second switching transistor T2 and the compound circuit V8 may be omitted.

The following values may be chosen, for example, for the symmetrical semiconductor crosspoint according to FIG. 6 in accordance with the invention:

R1 = R2 = 500Ω
R3 ≈ 30 kΩ (can be made as a pinch resistor)
R5 ≈ 30 kΩ (can be made as a pinch resistor)
R6 = 0Ω
U1 = 5 V, U2 = −3V, U3 = U1.

Resistor R4 may be provided jointly for a plurality of crosspoints. Preferably it is selected such that approximately 100 μA flows per inverter.

With the stated values the connected crosspoint takes up approximately 10 mW and may be carried out in an area of 0.6 mm$^2$. Thus the switching transistor including a P$^+$ separation framework takes up an area of approximately 0.015 mm$^2$ and with a base current $I_B$ = 1 mA has an on-state resistance of approximately 7Ω.

A plurality of the described low resistance switching transistors having their compound circuits V, flip flops FF and setting inverters INV3 and INV4 are arranged in the monolithic integrated semiconductor array in accordance with the invention. They are all controlled by a joint triggering logic also belonging to the monolithic integrated semiconductor array (housed on the same semiconductor chip).

With semiconductor arrays for telephone exchange devices, several switching transistors are usually attached to one line or column in a switching matrix. These switching transistors then have a common E connection. Thus considerable space may be saved on the monolithic integrated semiconductor array if all of the vertical NPN transistors lying on one line or column of a switching network and constructed as switching transistors are assembled in the second frame-like zone 8 (see FIG. 1) and have a common tank shaped zone 2 and 6.

Figure 7:
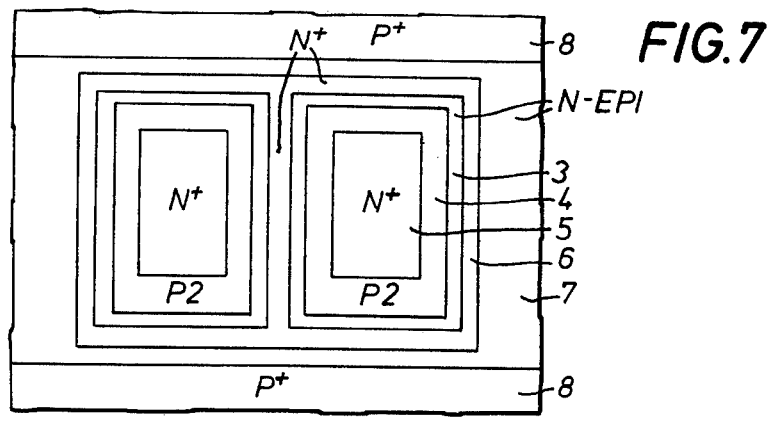
FIG. 7 shows the collecting together of several switching transistors in a common $P^+$ separation.

This modification of the switching transistors is shown in FIG. 7. The reference symbols correspond to those in FIGS. 1 and 2. Part of the common tank shaped region 2 and 6 is, in this embodiment, the N$^+$ bar between the two vertical NPN transistors.

Figure 8:
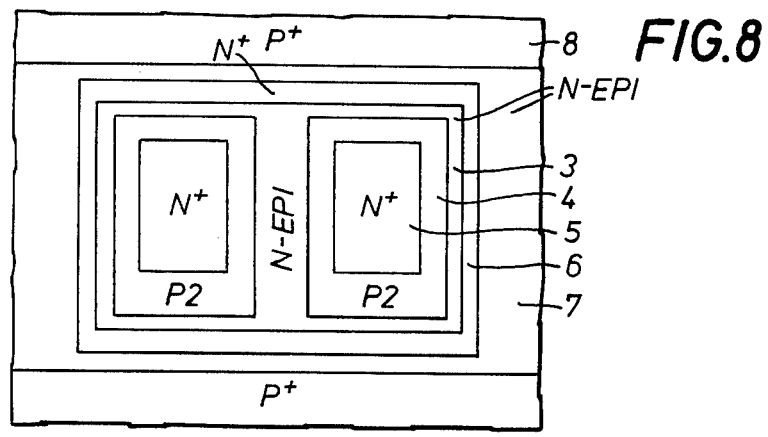
FIG. 8 shows the collecting together of several switching transistors in a $N^+$ tank.

If this N$^+$ bar is omitted, then the embodiment shown in FIG. 8 is achieved. Here too, the reference symbols correspond to those used in FIGS. 1 and 2 and those in FIG. 7. In this example all vertical NPN transistors lying on one line or column of a semiconductor array and constructed as switching transistors are assembled in the second frame-like area 8 and have a common tank shaped area 2 and 6.

It will be understood that the above description of the present invention is susceptible to various modification changes and adaptations.

What is claimed is:

1. A monolithical semiconductor circuit including an integrated semiconductor array having a plurality of low ON-state resistance switching transistors formed in a common semiconductor body in bipolar technology, particularly for use in switching networks of telephone exchanges and transmission devices, for selectively connecting a series of input lines as desired to one or several output lines, each of said switching transistors being constructed as a vertical NPN transistor which has a large downward current amplification factor and a large upward current amplification factor and is characterized by the following features:

(a) a first selective layer of a second type of conductivity opposite to a first type of conductivity introduced into a substrate region of said semiconductor body and of said first type of conductivity, (b) a less heavily doped second layer of said second type of conductivity epitaxially grown on said first layer, (c) a third layer of said first type of conductivity selectively introduced into said second layer, (d) a fourth layer having as large an area as possible of said second type of conductivity selectively introduced into said third layer, (e) a region of said second conductivity type encircling said second, third and fourth layer, which form said vertical NPN transistor, and forming a largely tank shaped region of said second type of conductivity with said first layer, (f) said tank shaped region is surrounded by a first frame-like region of said second type of conductivity, (g) said first frame-like region is surrounded by a second frame-like region of said first type of conductivity, said second frame-like region extending from the surface of said semiconductor body to said substrate, being more highly doped than said substrate and serving to insulate said vertical NPN transistor, and (h) said substrate, said tank-shaped region, and said third and fourth layer are provided with respective connections;

and wherein, for each of said switching transistors, said connection of said tank shaped region and the connection of said fourth layer are connected to the respective input and output lines to be switched through, said connection of said third layer is connected to a triggering circuit for the associated switching transistor and, as desired, to a control circuit, and said connection of said substrate is connected to a dc voltage potential which is negative with respect to said tank shaped region.

2. A circuit as defined in claim 1, wherein said tank shaped region completely surrounds said structure forming said vertical NPN transistor.

3. A circuit as defined in claim 1, wherein said triggering circuit and a plurality of said vertical NPN transistors are integrated in a common semiconductor body.

4. A circuit as defined in claim 1, wherein said triggering circuit and the control circuit and a plurality of said vertical NPN transistors are integrated in a common semiconductor body.

5. A circuit as defined in claim 1, wherein said connection of said tank shaped region of said vertical NPN transistor is connected to a first line of low resistance to direct current and at a reference potential, and said connection of said fourth layer is connected to a second line which is of high resistance to direct current and is to be connected to said first line.

6. A circuit as defined in claim 1, wherein said triggering circuit includes an interface circuit for triggering the respective vertical NPN transistor and a logic circuit part.

7. A circuit as defined in claim 6, wherein said logic circuit part emits a binary output signal and said interface circuit is so constructed that, with an output signal of one binary type, the output of said interface circuit acts as a high resistance current source switching on said vertical NPN transistor and, when there is an output signal of the other binary type, the output of said interface circuit acts as a low resistance voltage source disconnecting said vertical NPN transistor.

8. A circuit as defined in claim 7, wherein said current source of said interface circuit comprises a compound circuit.

9. A circuit as defined in claim 8, wherein said compound circuit comprises two complementary transistors where the NPN-transistor of said compound circuit is connected by its emitter to said third layer of said vertical NPN transistor, by its base to the collector of the PNP transistor of said compound circuit and by its collector to the emitter of said PNP transistor of said compound circuit and via a first resistor to a first voltage source whose voltage is selected for switching on said vertical NPN transistor via said compound circuit, and where said PNP transistor is connected by its base to a second resistor and, via a construction element bringing about a constant voltage drop, to said first voltage source.

10. A circuit as defined in claim 9, wherein said logic circuit part comprises a circuit constructed in accordance with I²L technique.

11. A circuit as defined in claim 10, wherein said logic circuit part contains a store, inverter, decoder and logic input and output circuits.

12. A circuit as defined in claim 11, and comprising an interface circuit and a store for each vertical NPN transistor.

13. A circuit as defined in claim 12, wherein said store contains a flip flop with two inverters in accordance with I²L circuit technology.

14. A circuit as defined in claim 13, wherein said inverters of said flip flop each include a NPN transistor each with at least two collectors insulated respectively from one another, with one of said two NPN transistors of said flip flop connected by its collector via said second resistor to said compound circuit and the other of said two NPN transistors of said flip flop being connected to said third layer of said vertical NPN transistor by at least one collector either directly or via an additional circuit.

15. A circuit as defined in claim 14, further comprising means for connecting one of the emitters of said two NPN transistors of said flip flop to a second voltage source and means for connecting the said other of said two NPN transistors of said flip flop directly to said third layer of said vertical NPN transistor by one collector.

16. A circuit as defined in claim 14, wherein said two NPN transistors of said flip flop have their emitters at reference potential and said other of said two NPN transistors of said flip flop is connected at one collector via an additional circuit to said third layer of said vertical NPN transistor; and wherein said additional circuit comprises a PNP transistor which is realized in accordance with the technology for I²L circuits and is connected by its base to one collector of said other of said two NPN transistors of said flip flop, and a NPN transistor connected by its base via a third resistor to its emitter which is directly connected to a fourth voltage source, by its base either directly or via a fourth resistor to the collector of said PNP transistor, and by a collector to said third layer of said vertical NPN transistor.

17. A circuit as defined in claim 14, further comprising further inverters in accordance with I²L circuit technology for setting said flip flop, with each said further inverter connected by its collector to the base of the respective NPN transistor of said flip flop.

18. A circuit as defined in claim 15 and comprising a pair of said vertical NPN transistors and said of compound circuits for every two pairs of said lines to be connected with said other of said two transistors of said flip flop having three collectors, one said collector connected directly to the respective one of said third layers of said two vertical NPN transistors.

19. A circuit as defined in claim 16 and comprising a pair of said vertical NPN transistors and of said compound circuits for every two pairs of lines to be connected, with said NPN transistor of said additional circuit having two collectors, one said collector being connected to the respective one of said third layers of said two vertical NPN transistors.

20. A circuit as defined in claim 9, wherein said transistors of said compound circuit comprise an assembly of a further vertical NPN transistor with a lateral PNP transistor, both made in accordance with the technology for I²L, with said lateral PNP transistor constructed to have as small a surface as possible and having a rectangular structure and a current amplification factor in emitter connection for alternating current of the order of magnitude of 2 to 4 in a collector current range of 5 to 20 μA.

21. A circuit as defined in claim 17, wherein said individual inverters of said flip flop also comprise a part of a control logic of the switching array.

22. A circuit as defined in claim 2, wherein all said vertical NPN transistors lying on one row or column of a switching array and constructed as switching transistors are brought together in said second frame-like region and a part of its respective tank shaped region is common to at least two of these said vertical NPN transistors.

23. A circuit as defined in claim 2, wherein all said vertical NPN transistors lying on one row or column of a switching array and constructed as switching transistors are brought together in said second frame-like region and have a common tank shaped region.

24. A monolithic integrated semiconductor switching array comprising a plurality of low on-state resistance vertical bipolar switching transistors formed in a common semiconductor body having a substrate region of a first type of conductivity, each of said switching transistors including a first layer of a second type of conductivity on said substrate region, a second layer of said second type of conductivity on said first layer and of lower doping than said first layer, a third layer of said first type of conductivity in said second layer, a fourth layer of said second type of conductivity in said third layer, a region of said second type of conductivity and more highly doped than said second layer, encircling said second, third and fourth layers to form a tank like structure with said first layer, a first frame-like region of said second type of conductivity encircling said tank like structure and being of a lower doping than said tank like structure, a second frame-like region of said first type of conductivity encircling said first frame-like region and in contact with said substrate region and first and second connecting means on said tank like structure and on said fourth layer respectively for connecting same to respective lines to be connected together by the associated transistor, third connecting means on said third layer for connection to a trigger circuit for the transistor and fourth connecting means on said substrate region for connection to a potential negative with respect to said tank like structure.

* * * * *